US006352803B1

(12) United States Patent
Tong et al.

(10) Patent No.: US 6,352,803 B1
(45) Date of Patent: Mar. 5, 2002

(54) COATINGS ON REFLECTIVE MASK SUBSTRATES

(75) Inventors: William Man-Wai Tong, Oakland; John S. Taylor, Livermore; Scott D. Hector, Oakland, all of CA (US); Pawitter J. S. Mangat, Gilbert, AZ (US); Alan R. Stivers; Patrick G. Kofron, both of San Jose, CA (US); Matthew A. Thompson, Austin, TX (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/587,836

(22) Filed: Jun. 6, 2000

Related U.S. Application Data

(60) Provisional application No. 60/138,158, filed on Jun. 7, 1999.

(51) Int. Cl.$^7$ .............................. G03F 9/00; B32B 9/00; B32B 15/00
(52) U.S. Cl. ............................ 430/5; 428/428; 428/433
(58) Field of Search .............................. 430/5; 428/433, 428/428, 426; 378/34, 35

(56) References Cited

U.S. PATENT DOCUMENTS

| | | | | |
|---|---|---|---|---|
| 5,878,105 A | * | 3/1999 | Jeon et al. | 378/35 |
| 5,958,629 A | * | 9/1999 | Yan et al. | 430/5 |
| 6,027,815 A | * | 2/2000 | Hsu | 430/5 |
| 6,042,995 A | * | 3/2000 | White | 430/5 |
| 6,048,652 A | * | 4/2000 | Nguyen et al. | 430/5 |
| 6,159,643 A | * | 12/2000 | Levinson et al. | 430/5 |

OTHER PUBLICATIONS

S.E. Gianoulakis et al., Thermal–mechanical performance of extreme ultraviolet lithographic reticles, Journal of Vacuum Science and Technology B, vol. 16(6), 3440–3, 1998.

S.E. Gianoulakis et al., Thermal management of EUV lithography masks using low expansion glass substrates, Emerging Lithographic Technologies III, SPIE Proceedings vol. 3679, 1999.

W.M. Tong et al., Mask substrate requirements and development for extreme ultraviolet lithography (EUVL), SPIE vol. 3873, Sep. 1999.

Patent Abstracts of Japan vol. 1998, No. 10 Aug. 31, 1998 & JP 10 144584 A.

Patent Abstracts of Japan vol. 1998, No. 006 Jan. 11, 1985 & JP 59 154452A.

Patent Abstracts of Japan vol. Vol. 1998 No. 11 Sep. 30, 1998 &JP 10 177943 A.

* cited by examiner

Primary Examiner—S. Rosasco
(74) Attorney, Agent, or Firm—L. E. Carnahan; Alan H. Thompson

(57) ABSTRACT

A process for creating a mask substrate involving depositing: 1) a coating on one or both sides of a low thermal expansion material EUVL mask substrate to improve defect inspection, surface finishing, and defect levels; and 2) a high dielectric coating, on the backside to facilitate electrostatic chucking and to correct for any bowing caused by the stress imbalance imparted by either other deposited coatings or the multilayer coating of the mask substrate. An film, such as TaSi, may be deposited on the front side and/or back of the low thermal expansion material before the material coating to balance the stress. The low thermal expansion material with a silicon overlayer and a silicon and/or other conductive underlayer enables improved defect inspection and stress balancing.

20 Claims, 1 Drawing Sheet

COATINGS ON REFLECTIVE MASK SUBSTRATES

RELATED APPLICATION

This application relates to U.S. Provisional Application No. 60/138,158 filed Jun. 7, 1999, and claims priority thereof.

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to reflective mask substrates for lithography, particularly to reflective mask substrates for extreme ultraviolet lithography, and more particularly to depositing coatings on the front and/or back of the mask substrate which enables the use of low thermal expansion material as the mask substrate and which compensates multilayer film stress effects on such substrates, and wherein additional coatings are applied to the front and/or back of the mask substrate.

Extreme ultraviolet lithography (EUVL) is a leading candidate for the next generation of lithography systems for fabricating semiconductor microelectronics. The key difference between EUVL and conventional lithography is that EUVL employs 13.4 nm light and therefore requires reflective optics and masks that are coated with multilayers (ML), typically Mo/Si. Development of low thermal expansion material (LTEM) transparent mask substrates that can be easily inspected for defects is an important area currently under development.

Thermal management of EUV lithography masks or reticles have become an important field in view of the current development efforts relating to the extreme ultraviolet lithography (EUVL) system. See S. E. Gianoulakis et al., "Thermal-mechanical performance of extreme ultraviolet lithographic rectiles", J. Vac. Sci. Technol. B 16 (6) 3440–3, November/December 1998; and S. E. Gianoulakis et al., "Thermal management of EUV lithography masks using low expansion glass substrates", Emerging Lithographic Technologies III, SPIE Proceedings, Vol. 3676, 1999.

Currently, epi-Si(100) wafers are used as substrates for EUVL mask blanks because of their desirable properties such as low defects, excellent flatness and finishing, and existence of inspection and ultraclean handling tools. However, silicon has an unacceptably large coefficient of thermal expansion. During the printing, ~40% of the EUV light is absorbed by the mask, and thermal expansion caused by the heating leads to a large image distortion that may exceed the error budget. Low thermal expansion material (LTEM) has been proposed as the substrate material for the EUVL masks. See W. M. Tong et al., "Mask substrated requirements and development for extreme ultraviolet lithography (EUVL)", SPIE Vol. 3873, September 1999. However, the use of LTEM substrates requires overcoming new challenges in the following areas.

1. Inspection

Defect count is a primary concern for EUVL mask fabrication, and defect inspection is a key step in reducing defects. Light scattering is employed in the state-of-the-art defect inspection tools. The scattering cross section for defects is enhanced by a surface that is reflective at visible wavelengths: the minimum detectable defect size detection threshold on transparent LTEM substrates, such as ULE (~0.12 $\mu$m) is higher than that on silicon surfaces (~60 nm). A means of enhancing the defect detection on transparent substrates is needed.

2. Surface Finishing

EUVL mask demands low flatness error and low roughness to minimize the image placement error and loss of reflectivity, respectively. Any method to help achieve the flatness and roughness requirements is desirable.

3. Defects

Currently, the defect count on non-silicon substrates are much higher than silicon wafers, because the demand by the semiconductor industry for low defects on silicon wafers has compelled the silicon substrate manufacturers to invest billions of dollars into reducing defects. It is highly desirable to make LTEM substrates to become more compatible with the existing tools that carry out state-of-the-art defect-inspection, cleaning, and other defect-reduction processes.

4. Electrostatic Mask Chuck

Electrostatic chucking of the mask is needed for various stages of EUVL mask fabrication. It has been demonstrated that electrostatic chucking during multilayer coating adds fewer defects to the mask than mechanical chucking. Furthermore, electrostatic chucking is one of the two options under evaluation for mounting the mask during patterning, inspection, and exposure of the mask. However, most LTEMs, unlike silicon, have low dielectric constants and requires a much higher voltage to achieve the same chucking force. A high voltage can create an electric field that can potentially interfere with the processing step or cause an electrical breakdown in the vacuum. The LTEM substrate must be made compatible to a low-voltage electrostatic chuck.

5. Stress Balancing

A substrate with any kind of coating may bow because of stress imbalance between the two. In EUVL mask, this problem is particularly acute because the substrate has near zero expansion and a typical coating such as silicon has a CTE that is often 1 or 2 orders of magnitude higher. One possible mechanism for stress formation is as follows: the ML deposition on the LTEM substrate is carried out at about 70° C. After the deposition, the temperature returns to the ambient and the MLs contract. Since the LTEM substrate will not contract, this creates a stress imbalance and results in a bowed substrate. A technique to overcome this bowing caused by the stress imbalance is necessary.

The present invention provides a solution to the above problems and enables the use of low thermal expansion material (LTEM) as a substrate material for EUVL masks. The invention basically involves depositing coatings on the front and/or back surfaces of the LTEM substrate. The front coatings will enhance defect inspection, defect reduction, surfaces finishing, and stress balance of the substrate, while the back coatings will enhance electrostatic chucking and stress balance of the substrate.

SUMMARY OF THE INVENTION

It is an object of the present invention to enable the use of low thermal expansion material as a mask substrate for a photolithography.

A further object of the invention is to provide a process that employs coatings, such as silicon, metal, or multilayers to fabricate an EUVL mask substrate composed of low thermal expansion material, which may or may not be transparent.

Another object of the invention is to provide a transparent or non-reflective low thermal expansion material mask substrate with a coating, such as silicon, to provide for improved defect inspection.

Another object of the invention is to provide a mask substrate with a front coating that either has a smoothing effect and/or can be polished to provide for improved surface finishing.

Another object of the invention is to provide a mask substrate with a front coating, such as silicon and molybdenum, to provide for reduction of surface defects.

Another object of the invention is to provide a mask substrate with a back coating of material with a higher dielectric constant than the substrate, such as silicon, molybdenum, chromium, chromium oxynitride, or TaSi, to facilitate electrostatic chucking of the substrate.

Another object of the invention is to provide a mask substrate with a coating on the front and/or the back to correct stress induced bowing of the substrate, with the coatings containing materials such as silicon, molybdenum, chromium, chromium oxynitride, TaSi, and Mo/Si multi-layer stocks.

Other objects and advantages of the present invention will become apparent from the following description and accompanying drawings. Basically, the invention involves coating a mask substrate with a coating on the front, on the back, and/or on both. The coating on the front of the mask is to enhance defect inspection, improve surface finishing, reduce defect levels, and/or correct for bowing of the substrate caused by the stress imbalance between the other coatings and the mask substrate. The high dielectric coating on the back of the substrate is to facilitate electrostatic chucking, enhance defect inspection, and/or correct for bowing of the substrate caused by the stress imbalance imparted by either the deposited silicon layer and/or the ML coating on the front of the mask substrate. More specifically, the invention involves a mask substrate composed of a low thermal expansion material (LTEM) substrate coated with material, such as silicon, on the front side and coated with at least a high dielectric coating, such as a metal, on the back side. The silicon coating on one or both sides of a LTEM provides a transparent EUVL mask substrate with improved defect inspection, surface finishing, and defect levels. The extra coating and a coating having a high dielectric constant on the back side of the substrate facilitates electrostatic chucking and to correct for any bowing of the substrate caused by the stress imbalance imparted by either the deposited silicon layer on the multilayer coating on the front side of the mask substrate. In addition, providing a film, which may be amorphous, intermediate the front side of the LTEM substrate and the silicon coating or between the silicon coating and the multilayer serves to balance the stress. The transparent mask substrates of this invention, in addition to EUVL mask applications, have applications in of other lithography systems to pattern semiconductor dies for integrated circuit manufacturing.

BRIEF DESCRIPTION OF THE DRAWINGS

The accompanying drawings, which are incorporated into and form a part of the disclosure, illustrate embodiments of the invention and, together with the description, serve to explain the principles of the invention.

DETAILED DESCRIPTION OF THE INVENTION

Figure 1:
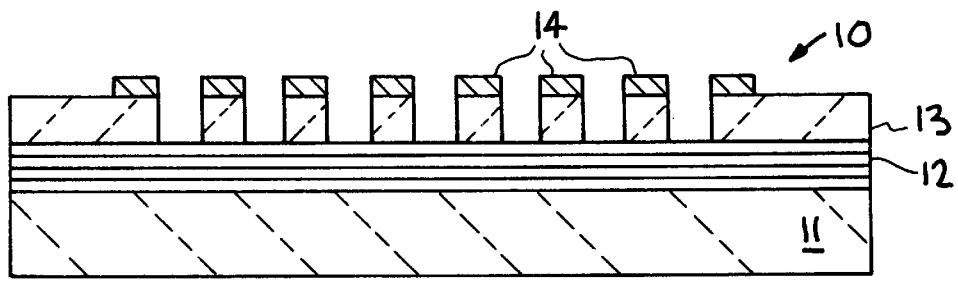
FIG. 1 is a cross sectional view of an embodiment of prior art EUVL mask substrate.

The present invention is directed to the use of coatings, such as silicon and metal coatings, on mask substrates, such as low thermal expansion material (LTEM) mask substrates, for photolithography that employs reflective mask substrates, such as utilized in EUVL systems. The invention involves depositing one ore more coatings on one or both sides of an LTEM mask substrate to improve defect inspection, surface finishing, and defect levels; providing a conducting coating on the backside of the substrate to facilitate electronic chucking and to correct for any bowing caused by the stress imbalance imparted by either the deposited silicon layer or layers on the frontside and/or backside, or the multilayer coating of the mask substrate. The deposited coatings may be composed of silicon, molybdenum, chromium, chromium oxynitride, TaSi or Si/Mo multilayers. Also, an amorphous film of material, such as TaSi can be sandwiched between the LTEM and a-Si film on the frontside to balance the stress. Low thermal expansion material is defined as material with a coefficient of thermal expansion <1 ppm/K, and maybe composed of selected glass, glass-ceramics, plastics, ceramics, composites, etc. Examples of the LTEM's include Zerodur made by Schott Glass Technologies, Duryea, Pa.; UIE made by Corning, Inc., Corning, N.Y.; ClearCeram made by Ohara Corp., Sagamihara, Japan; SiC, quartz, and dry-silica. As defined herein, front or the front side of the mask is the side to be patterned.

Coating the LTEM substrate with at least one front side overlayer and/or one back side material can solve the problems outlined above, and described individually hereinafter and summarized in Table 1.

1. Inspection: A transparent or translucent mask substrate with a reflective coating such as silicon allows for defect inspection by today's state-of-the-art silicon defect inspection tools. The sensitivity and speed of inspection of these tools are currently much higher than their counterparts for inspecting non-reflective substrates.

2. Surface Finishing: A silicon overlayer allows access to the mature finishing capabilities of the silicon industry. A coating of 1–5 $\mu$m silicon, which may be amorphous, polycrystalline, or otherwise, can be polished and processed to the same degree of flatness and low-roughness as a silicon wafer. This provides a pathway for the mask substrate to achieve the same finishing as the silicon wafer.

3. Defects reduction: The advantages of having a front coating are three-fold: first, the coating may be made of a material that is easier to clean than the native LTEM substrate. For example, a mask substrate with a front coating of silicon allows access to the existing sophisticated cleaning technologies and processes that have been developed for silicon wafers. Second, a coating such as silicon or chromium can render the substrate opaque to visible light which is used for sensors in automated handling equipment employed in state-of-the-art low defect process equipment. Thus, compatibility with present processing tools is significantly enhanced. Third, any contaminants on the substrates will be encased by the overcoat so that they cannot enter the process tools and will not compromise other processes conducted in those tools. Furthermore, a front coating of silicon can be easily repolished to a better finish and cleanliness than the original the LTEM substrate surface because of more advanced state of the art for finishing silicon substrates.

4. Electrostatic Chuck: The electrostatic chuck has been proposed for mounting the mask substrate for patterning, inspection, and exposure, and its use would be facilitated by a substrate material with a high dielectric constant. Most mask substrate materials, such as LTEM and quartz, have low dielectric constants. A coating with a high dielectric constant on the backside of the substrate, including but not limited to silicon, TiN, molybdenum, chromium, TaSi, and/or Mo/Si ML stack will facilitate the use of an electrostatic chuck.

5. Stress Balancing: The coating on the backside can also be used to correct the bow caused by the ML on the front. The thickness of the back coating depends on what is required to correct the stress imbalance the substrate and its other coatings. A coating of silicon, molybdenum, chromium, chromium oxynitride, TaSi, or a Mo/Si ML-stack can be used. In particular, coatings such as TaSi and chromium oxynitride, whose stress is adjustable by annealing, can also be tailored to meet the stress-balancing need of individual masks.

TABLE 1

Purposes, locations, and examples of coatings described in this invention.

| Purpose | Surface Location of coatings | Examples of coating materials | Notes |
| --- | --- | --- | --- |
| Improve defect inspection sensitivity | Front | Si, Mo, Cr, or other reflective materials | Defect detection sensibility is much higher on reflective than on transparent or translucent surfaces. |
| Reduce defects | Front | Si | Cleaning technologies are more advanced for silicon surfaces than for LTEM surfaces. A thicker silicon film (~1–5 $\mu$m) can also be repolished with the cleaner silicon polishing tools. |
| Balance the stress between the substrates and the coatings | Front and back | Si, Mo, Cr, Mo/Si ML stack, chromium oxynitride or TaSi | The stress of silicon, chromium, molybdenum films can be adjusted by varying their thicknesses. The stress of a chromium oxynitride or TaSi film can be adjusted by annealing. |
| Finishing | Front | Si | The current state of the art for finishing silicon wafers is more advanced than that for finishing LTEM substrates. |
| Facilitate electrostatic chucking | Back | Si, Mo, Cr, Mo/Si ML stack, chromium oxynitride, or TaSi | A material with a higher dielectric constant than the LTEM substrate will facilitate electrostatic chucking at a lower voltage. |

Referring now to the drawings, FIG. 1 illustrates an embodiment of a prior art EUVL mask substrate, generally indicated at 10, and is composed of a mask substrate 11 of LTEM, for example, multilayers 12, such as Mo/Si, a buffer layer 13 for mask pattern repair, such as silicon dioxide, and an absorber pattern 14, such as TiN and Cr.

Figure 2:
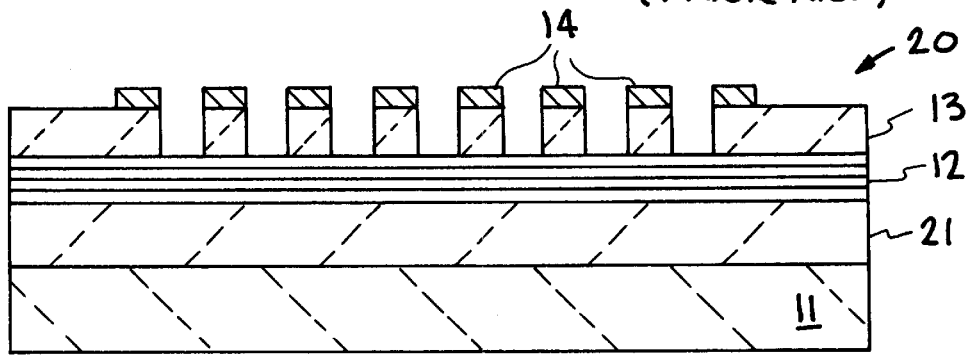
FIG. 2 shows an embodiment of an EUVL mask substrate with one or more front coatings made in accordance with the present invention.
Figure 3:
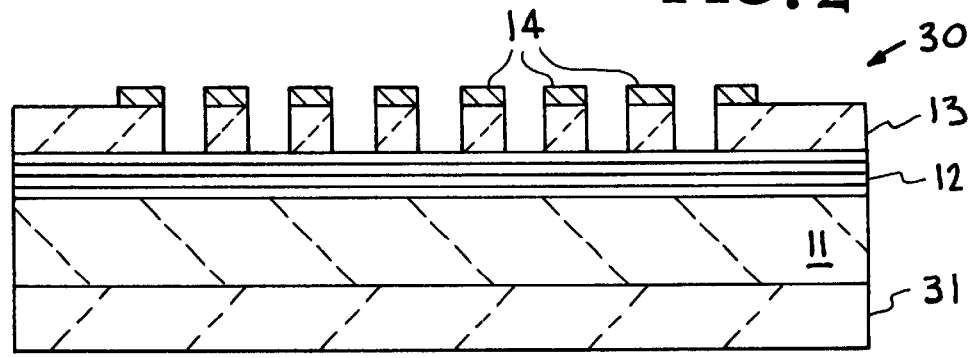
FIG. 3 shows an embodiment of an EUVL mask substrate with one or more back coatings in accordance with the present invention.
Figure 4:
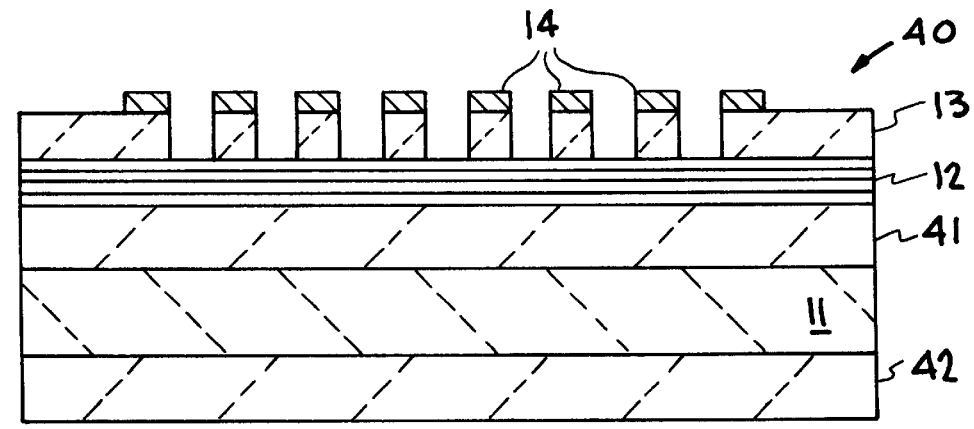
FIG. 4 shows an embodiment of an EUVL mask substrate with one or more front coatings and one or more back coatings in accordance with the present invention.

FIGS. 2–4 illustrate embodiments of an EUVL mask substrate similar to that of FIG. 1 and which includes one or more layers of material deposited on the front, back, or both sides of the substrate 11 of FIG. 1. Components corresponding to those of FIG. 1 are given corresponding reference numerals. In FIG. 2, the EUVL mask substrate 20 comprises a substrate 11, multilayers 12, buffer layer 13, and an absorber pattern 14, as in FIG. 1, but with an addition of a front coating 21 located between substrate 11 and multilayers 12 to enhance defect inspection, balance stress, smooth defects, and/or be repolished. The front coating 21 is composed of material such as Si, Mo, Cr, chromium oxynitride, TaSi, or Mo/Si multilayers.

FIG. 3 illustrates an EUVL mask substrate 30 which comprises a substrate 11, multilayers 12, buffer layer 13, and an absorber pattern 14, as in FIG. 1, but with an addition of a back coating 31 on the substrate 11 that facilitates electrostatic chucking and/or balance stress. The back coating 31 is composed of material such as Si, Mo, Cr, chromium oxynitride, TaSi, or Mo/Si multilayers.

FIG. 4 illustrates an EUVL mask substrate 40 which comprises a substrate 11, multilayers 12, buffer layer 13, and an absorber pattern 14, as in FIG. 1, but with the addition of a front coating 41 between substrate 11 and multilayers 12, as in FIG. 2, and a back coating 42 on the substrate 11, as in FIG. 3, whereby the front coating 41 enhances defect inspection, balance stress, smooth defects, and/or be repolished, as in FIG. 2; and whereby back coating 42 facilitates electrostatic chucking and/or balance stress, as in FIG. 3. The coatings 41 and 42 may each be composed of materials such as Si, Mo, Cr, chromium oxynitride, TaSi, or Mo/Si multilayers.

While the front coatings 21 and 41 and the back coatings 31 and 42 are shown as being single layer coatings, each coating may be of a single layer and/or of a multiple layer configuration.

It has thus been shown that the present invention provides a solution to the previous problems associated with inspection, surface finishing, defects, stress balancing, and electrostatic chuck retention in the formation of mask substrates, such as for EUVL systems or other lithography techniques for patterning semiconductor dies for integrated circuit manufacturing. By application of coatings on the front and/or back of the mask substrate surface to enhance defect inspection, improve surface finishing, reduce defects, facilitate electrostatic chucking, and/or correct stress imbalance, the present invention greatly advances the state of the art for photolithographic mask fabrication techniques.

While particular embodiments of a mask substrate utilizing low thermal expansion material have been illustrated and described, along with specified materials and parameters, to exemplify and describe the principles of the invention, such are not intended to be limiting. Modifications and changes may become apparent to those skilled in the art, and it is intended that the invention be limited only be the scope of the appended claims.

What is claimed:

1. A mask substrate, including:
    a single layer substrate composed of low thermal expansion material,
    at least one layer of material on a front side of said single layer substrate, and
    at least one layer of material on the back side of said single layer substrate.

2. The mask substrate of claim 1, additionally including a layer of material intermediate the back side of said substrate and said layer of material.

3. The mask substrate of claim 2, wherein said material on the backside of said substrate includes a layer of silicon composed of amorphous silicon or polycrystalline silicon.

4. The mask substrate of claim 1, additionally including a layer of stress balancing material intermediate the front side of said substrate and said layer of material.

5. The mask substrate of claim 4, wherein said layer of stress balancing material is composed of TaSi or chromium oxynitride.

6. The mask substrate of claim 1, additionally including a multilayer structure on the layer on material on the front side.

7. The mask substrate of claim 1, wherein said layer of material on the front side is selected from the group of Si, Mo, Cr, chromium oxynitride, TaSi, and Mo/Si multilayers.

8. The mask substrate of claim 1, wherein said layer of material on said front side is silicon and is composed of amorphous or polycrystalline silicon.

9. The mask substrate of claim 1, wherein said layer of material on the back side is selected from the group consisting of Si, Mo, Cr, chromium oxynitride, TiSi, and Mo/Si multilayers.

10. The mask substrate of claim 9, wherein said material on said back side is a metal selected from the group consisting of Mo and Cr or a material with a high dielectric constant selected from the group consisting of TiN, TaSi and chromium oxynitride.

11. The mask substrate of claim 1, wherein said low thermal expansion material is selected from the group consisting of glass, plastic, ceramic, glass-ceramic, composites, plastics, SiC, quartz, and dry silica.

12. In a process for fabricating a mask substrate containing at least a multilayer structure on the front side of a substrate, the improvement comprising:
    forming the substrate of low thermal expansion material,
    forming a layer of material intermediate the substrate and the multilayer structure to enhance defect inspection, improve surface finishing, reduce defect levels, and correct stress imbalance,
    said layer of material being selected from the group consisting of silicon, molybdenum, chromium, chromium oxynitride, TaSi, and Mo/Si multilayers, and
    forming at least one layer of material on the backside of the substrate to facilitate at least one of the group of electrostatic chucking, enhance defect inspection and correct for bowing of the substrate caused by stress imbalance.

13. The process of claim 12, wherein forming the layer on the backside is carried out by forming the layer from a material having a dielectric constant.

14. The process of claim 12, wherein forming the layer on the backside is carried out by forming a layer of silicon on the backside of the substrate, and forming a layer of the high dielectric material on the silicon layer.

15. The process of claim 14, wherein forming the layer of high dielectric material is carried out using material selected from the group consisting of metals and conductive compounds.

16. The process of claim 12, wherein the first-mentioned layer of material is composed of silicon, and additionally including forming a layer of stress balancing material between the frontside of the substrate and the silicon layer.

17. A transparent EUVL mask substrate, comprising:
    a substrate composed of low thermal expansion material,
    a first layer of silicon on a frontside of said substrate,
    a multilayer structure on said first layer of silicon,
    a second layer of silicon on a backside of said substrate, and
    a layer of conductive material on said second layer of silicon.

18. The mask substrate of claim 17, additionally including a film of stress balancing material between the frontside of said substrate and said first layer of silicon.

19. The mask substrate of claim 17, wherein said low thermal expansion material is selected from the group consisting of glass, plastic, composites, glass-ceramics and ceramic; wherein said first layer of silicon is composed of amorphous or polycrystalline silicon; and wherein said layer of conductive material is selected from the group consisting of metal and high dielectric materials.

20. The mask substrate of claim 18, wherein said stress balancing material film consisting of TaSi.

* * * * *